(12) United States Patent
Chikarmane et al.

(10) Patent No.: US 7,525,197 B2
(45) Date of Patent: Apr. 28, 2009

(54) BARRIER PROCESS/STRUCTURE FOR TRANSISTOR TRENCH CONTACT APPLICATIONS

(75) Inventors: Vinay Chikarmane, Portland, OR (US);
Kevin Fischer, Hillsboro, OR (US);
Brennan Peterson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 239 days.

(21) Appl. No.: 11/496,291

(22) Filed: Jul. 31, 2006

(65) Prior Publication Data

US 2008/0026556 A1   Jan. 31, 2008

(51) Int. Cl.
*H01L 21/44* (2006.01)
(52) U.S. Cl. .................. 257/751; 257/774; 257/763
(58) Field of Classification Search .......... 257/774, 257/751, 763, E29.156
See application file for complete search history.

(56) References Cited

U.S. PATENT DOCUMENTS

| 5,929,526 | A  | * | 7/1999 | Srinivasan et al. ........ 257/768 |
| 6,091,148 | A  | * | 7/2000 | Givens et al. ............. 257/750 |
| 6,348,709 | B1 | * | 2/2002 | Graettinger et al. ........ 257/311 |
| 6,750,146 | B2 | * | 6/2004 | Huang et al. .............. 438/694 |
| 6,770,954 | B2 | * | 8/2004 | Lee et al. ................. 257/616 |
| 7,041,595 | B2 | * | 5/2006 | Chopra ..................... 438/643 |
| 7,223,689 | B2 | * | 5/2007 | Park et al. ................. 438/629 |
| 2002/0019127 | A1 | * | 2/2002 | Givens ..................... 438/637 |
| 2007/0020923 | A1 | * | 1/2007 | Kraus et al. ............... 438/644 |

* cited by examiner

*Primary Examiner*—Eugene Lee
(74) *Attorney, Agent, or Firm*—Lee & Hayes, PLLC

(57) ABSTRACT

A barrier architecture is provided that includes different materials that are selected to be employed in connection with copper contact applications. Some of the barrier material is formed over trench contact sidewalls, and other different barrier material is formed over trench contact bottoms. By selecting the appropriate barrier materials, electromigration can be improved while, at the same time, interconnect and contact resistances can be kept low and array leakage can be mitigated.

9 Claims, 7 Drawing Sheets

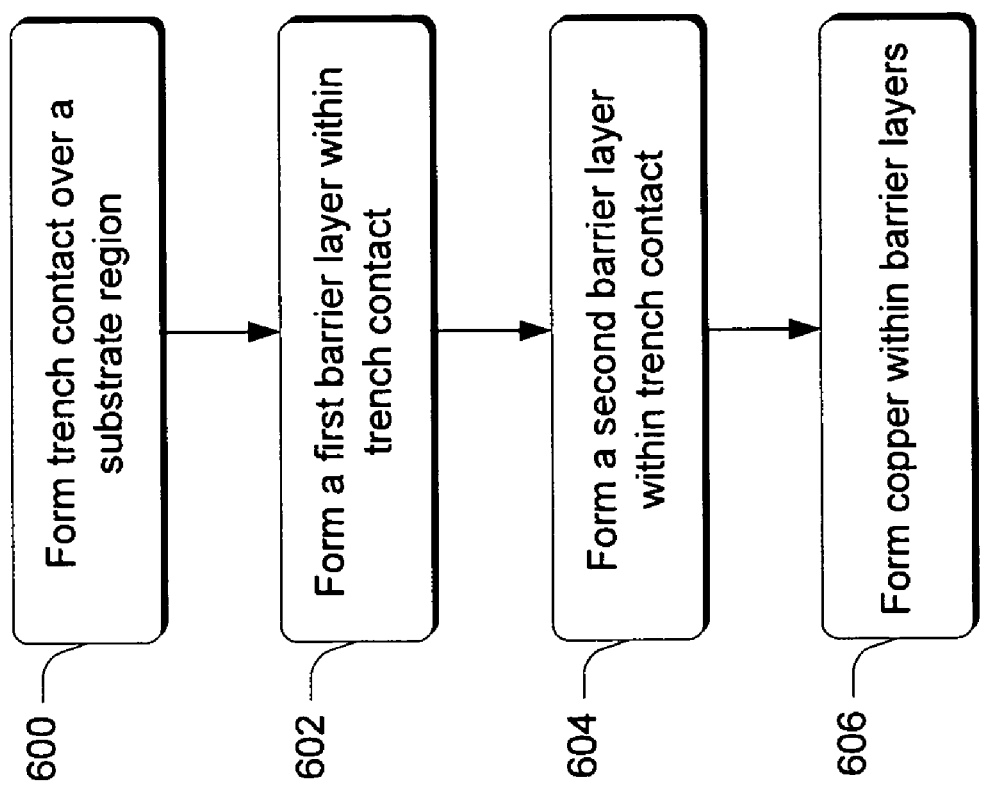

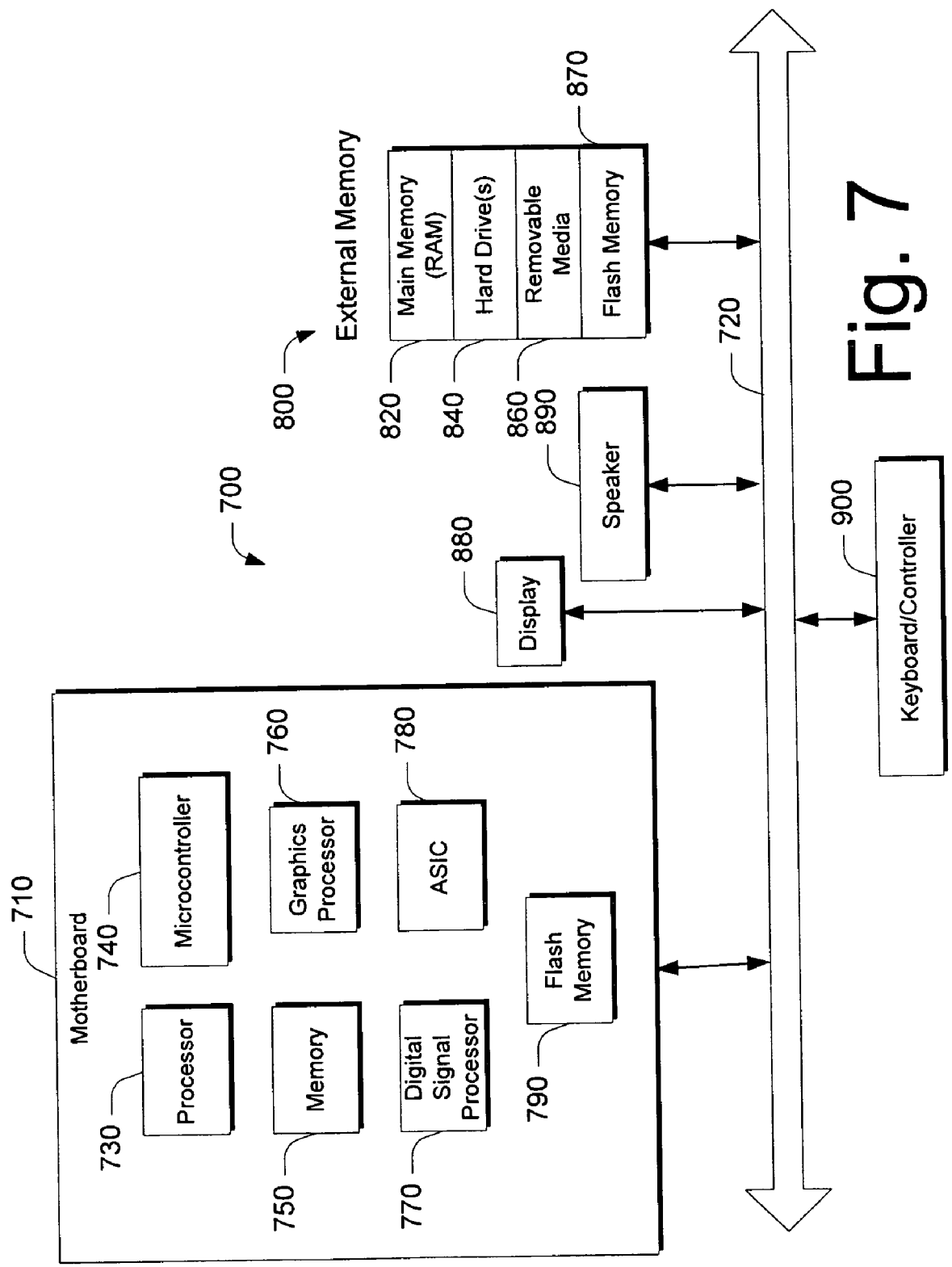

BARRIER PROCESS/STRUCTURE FOR TRANSISTOR TRENCH CONTACT APPLICATIONS

BACKGROUND

Using copper for interconnections for transistor source/drain and gate regions can present some design challenges. For example, copper that is formed within typical trench contacts should be well contained to avoid issues associated with what is known as array leakage. Array leakage occurs when the copper within the trench contact leaks into or extrudes into underlying substrate regions. This can and typically does compromise a device.

One way to contain the copper is to provide a barrier layer within the trench contact. Typically, a common approach is to form a relatively strong barrier having a metallurgical consistency that is the same along both the sidewalls and the bottom of the trench contact. This, however, is not the best approach as it can lead to compromise of the line and contact resistances. That is, in the interest of having a robust barrier to address array leakage, line and contact resistances can be compromised.

BRIEF DESCRIPTION OF THE DRAWINGS

FIG. 6 is a flow diagram that illustrates acts in accordance with one embodiment.

FIG. 7 is a diagram that illustrates an exemplary system in which transistors formed in accordance with the embodiments described herein can be used, in accordance with one embodiment.

DETAILED DESCRIPTION

In the embodiments described below, a barrier is formed within a trench contact and contains copper that makes an electrical connection with a desired substrate region. In the illustrated and described embodiments, the barrier's metallurgical consistency is different over the trench contact's sidewalls from its metallurgical consistency over the bottom of the trench contact.

In at least some embodiments, the barrier is formed by first forming a first barrier layer within the trench contact and over the sidewalls and bottom of the contact. First barrier layer material is then removed from over the contact bottom and then a second barrier layer, different from the first barrier layer, is formed over the contact sidewalls and the substrate region with which electrical connection is desired. Following this, copper is formed within the trench contact to be in electrical communication with the desired substrate region.

The desired substrate region can comprise any suitable region such as a source region, drain region, gate region and the like.

In the discussion that follows, a specific implementation example is provided under the heading "Implementation Example". It is to be appreciated and understood that such implementation example is not to be used to limit application of the claimed subject matter to only this example. Rather, changes and modifications can be made without departing from the spirit and scope of the claimed subject matter.

Implementation Example

Figure 1:
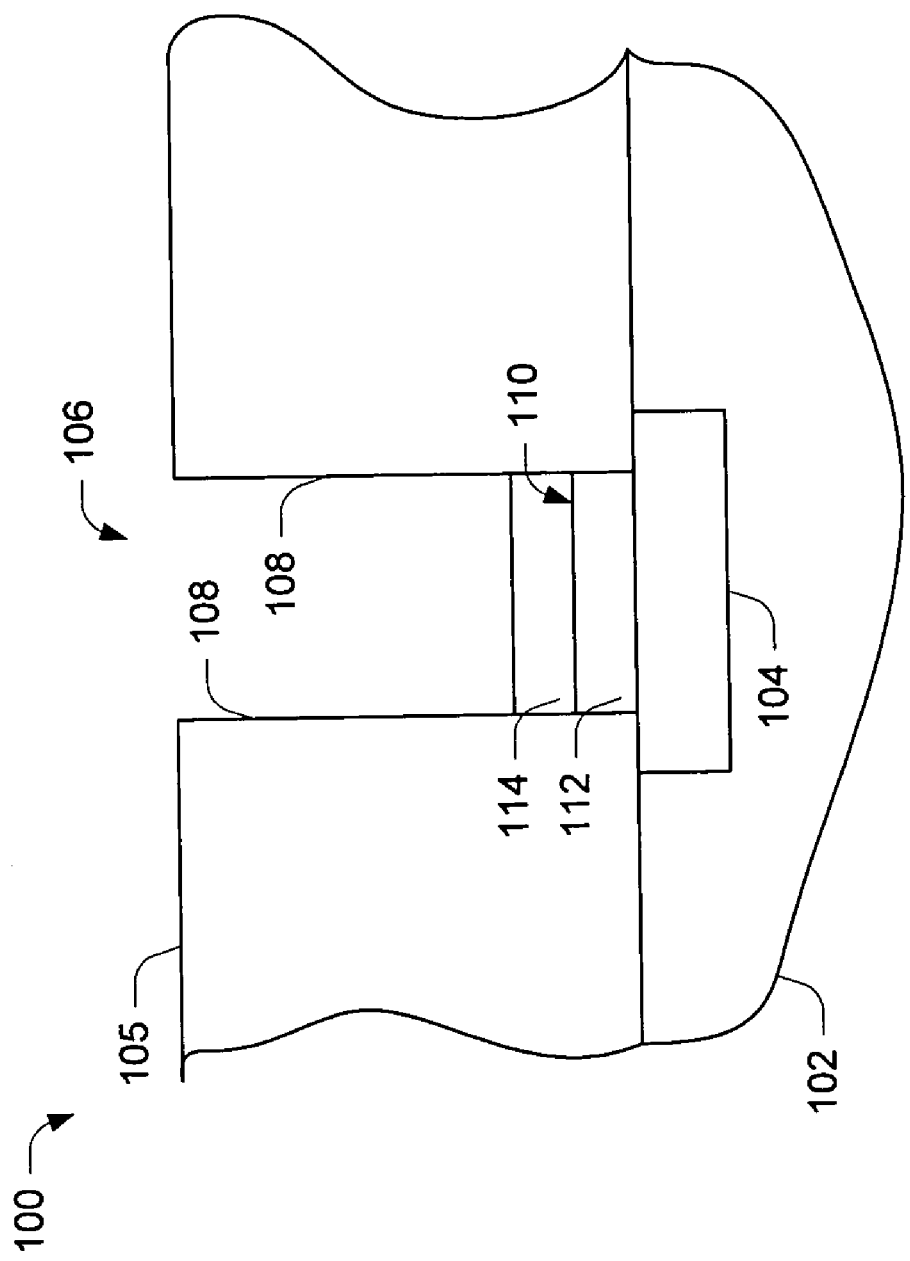
FIG. 1 is a diagrammatic side sectional view of a semiconductive substrate in process in accordance with one embodiment.

Referring to FIG. 1, a semiconductive substrate in process is shown generally at 100. Substrate 100 can comprise any suitable substrate material and can have any suitable number of layers through which one or more trench contacts, as described below, can be formed. In this particular example, substrate 100 comprises a bulk monocrystalline silicon substrate 102 having a region 104 with which electrical connection is desired. As noted above, substrate region 104 can comprise any suitable region with which electrical connection is desired. Such regions can include, by way of example and not limitation, source regions, drain regions, gate regions and the like.

In the illustrated and described embodiment, an insulative material 105 is formed over the substrate and a trench contact 106 is formed in the insulative material. Any suitable material can be utilized as insulative material, with $SiO_2$ serving as but one non-limiting example. In addition, the trench contact can be formed using any suitable technique, such as a masked etch.

In this particular example, trench contact 106 is defined by a pair of sidewalls 108 which extend toward the substrate and terminate at or adjacent a contact bottom 110. In this particular example, contact bottom 110 is defined by the upper surface of a salicide layer 112, which is in electrical communication with substrate region 104. In addition, in this particular example, salicide layer 112 is overlaid by an oxide layer 114. It is to be appreciated and understood that the contact bottom can be defined by other materials, such as the upper surface of region 104.

Figure 2:
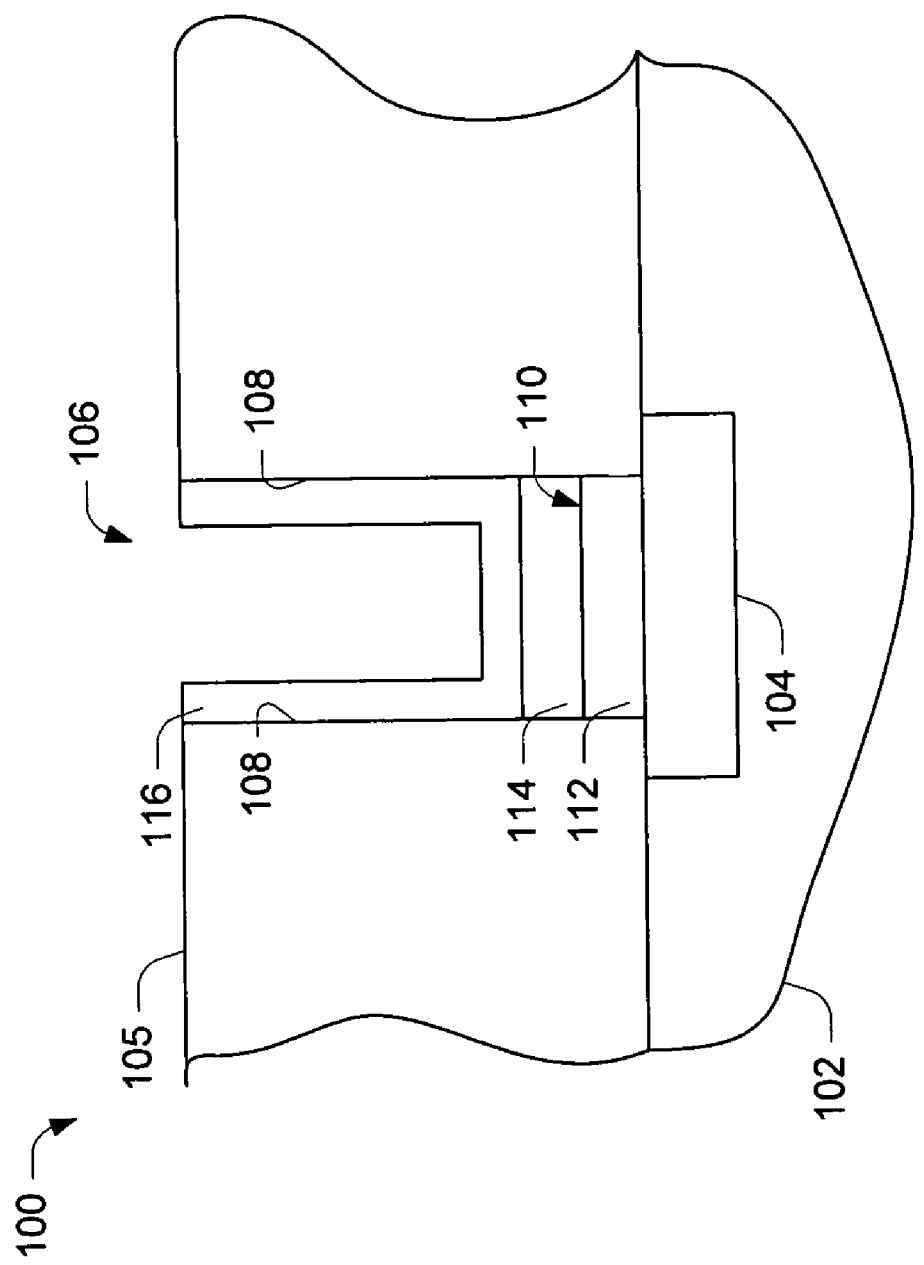
FIG. 2 is a diagrammatic side sectional view of the FIG. 1 substrate at a processing step subsequent to that shown in FIG. 1, in accordance with one embodiment.

Referring to FIG. 2, a first barrier layer 116 is formed within trench contact 106. Layer 116 is designed to meet electromigration requirements while maintain a low RC to aid in transistor switching speed. As formed, the first barrier layer overlays sidewalls 108 and the bottom of the trench contact. Any suitable technique can be utilized to form first barrier layer 116. In one embodiment, layer 116 is deposited using a high bias resputter process. Any suitable materials can be utilized for layer 116. In at least some embodiments, layer 116 comprises a metal and/or a nitrogen-containing material, such as any suitable metal nitride, such as tantalum nitride, titanium nitride and the like.

Figure 3:
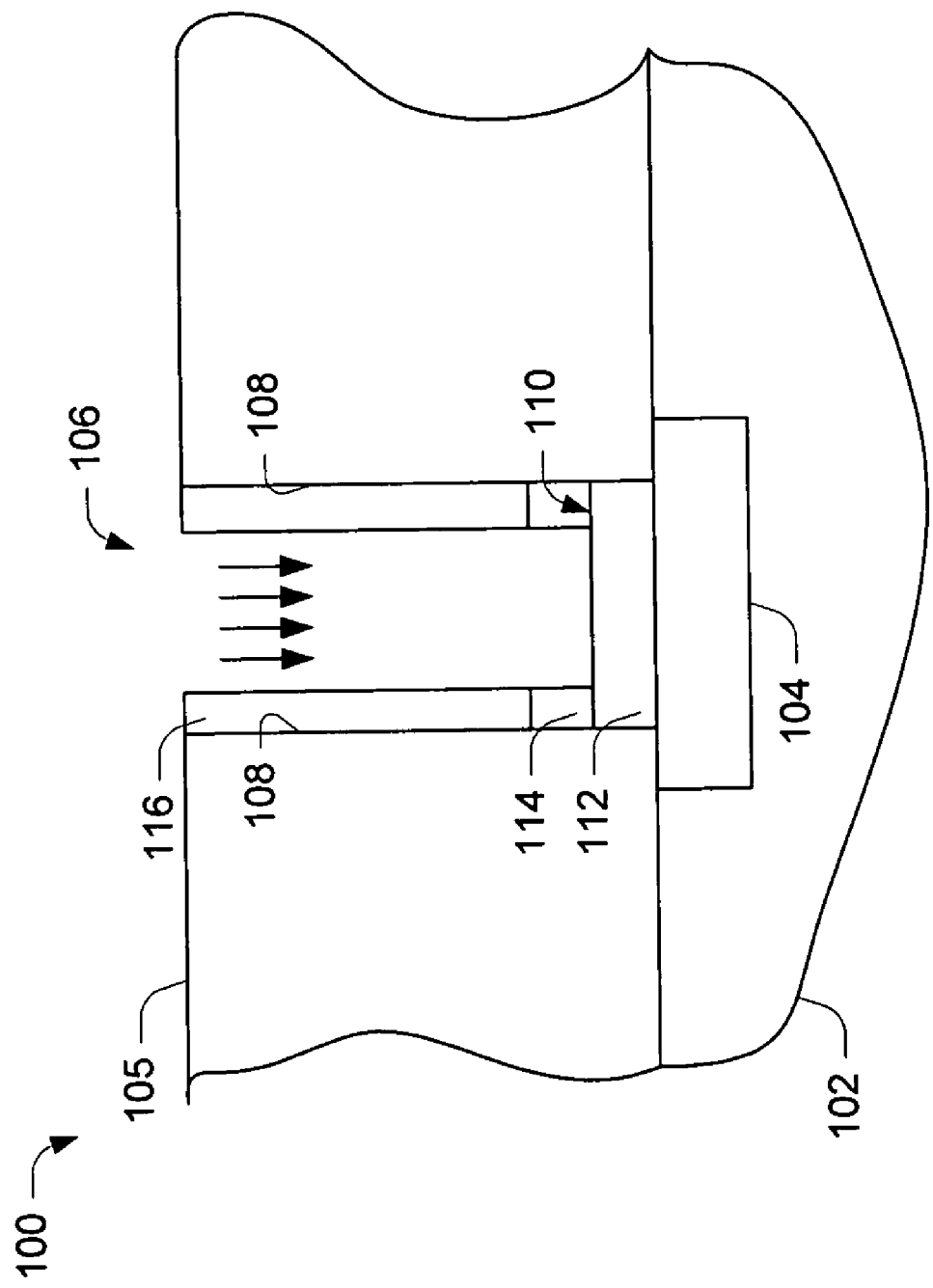
FIG. 3 is a diagrammatic side sectional view of the FIG. 2 substrate at a processing step subsequent to that shown in FIG. 2, in accordance with one embodiment.

Referring to FIG. 3, material from over contact bottom 110 is removed to expose the contact bottom. Any suitable technique can be used to remove the material overlying the contact bottom. In this particular example, a sputter etch is employed to remove not only material of layer 116 that overlays the contact bottom, but also material of the oxide layer 114 that overlays the contact bottom. In at least some embodiments, the sputter etch is an Argon sputter etch. In this particular example, material of layer 116 that is not removed serves as a hardmask for underlying material. By serving as a hardmask, the material of layer 116 can reduce or eliminate feature flaring, as will be appreciated by the skilled artisan.

Figure 4:
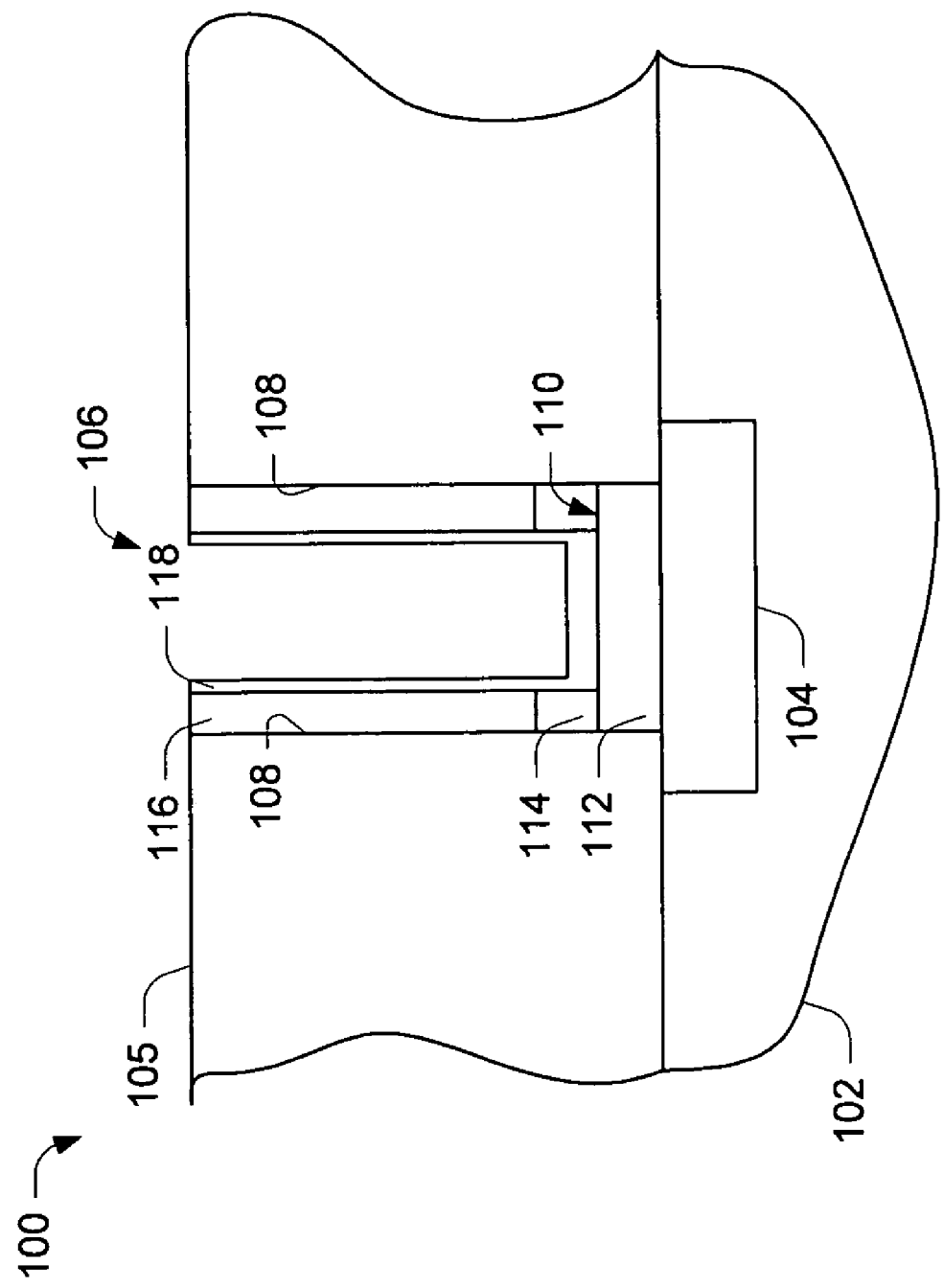
FIG. 4 is a diagrammatic side sectional view of the FIG. 3 substrate at a processing step subsequent to that shown in FIG. 3, in accordance with one embodiment.

Referring to FIG. 4, a second barrier layer 118 is formed within trench contact 106 and over contact bottom 110. In this particular example, layer 118 is formed over first barrier layer 116. In the illustrated and described embodiment, layer 118 is deposited using a low bias resputter ratio which effectively provides a desired thickness over the contact bottom 110. Additionally, the low bias resputter process reduces the thickness of layer 118 over sidewalls 108, as compared with the layer's thickness over contact bottom 110. In one embodiment, the thickness of layer 118 over the sidewall is about 15% of the thickness of the layer over the contact bottom. Layer 118 is designed to provide low contact resistance to the contact to achieve high drive currents and block array leakage.

In the illustrated and described embodiment, the metallurgical consistency of layer 118 is different from the metallurgical consistency of layer 116. In at least some embodiments, layer 118 is formed from a metal material examples of which include, by way of example and not limitation, tantalum, titanium and the like. In addition, the metallurgy and thickness of layer 118 can be selected to achieve a desirably low contact resistance while, at the same time, contain copper that is to be formed in the trench contact.

Figure 5:
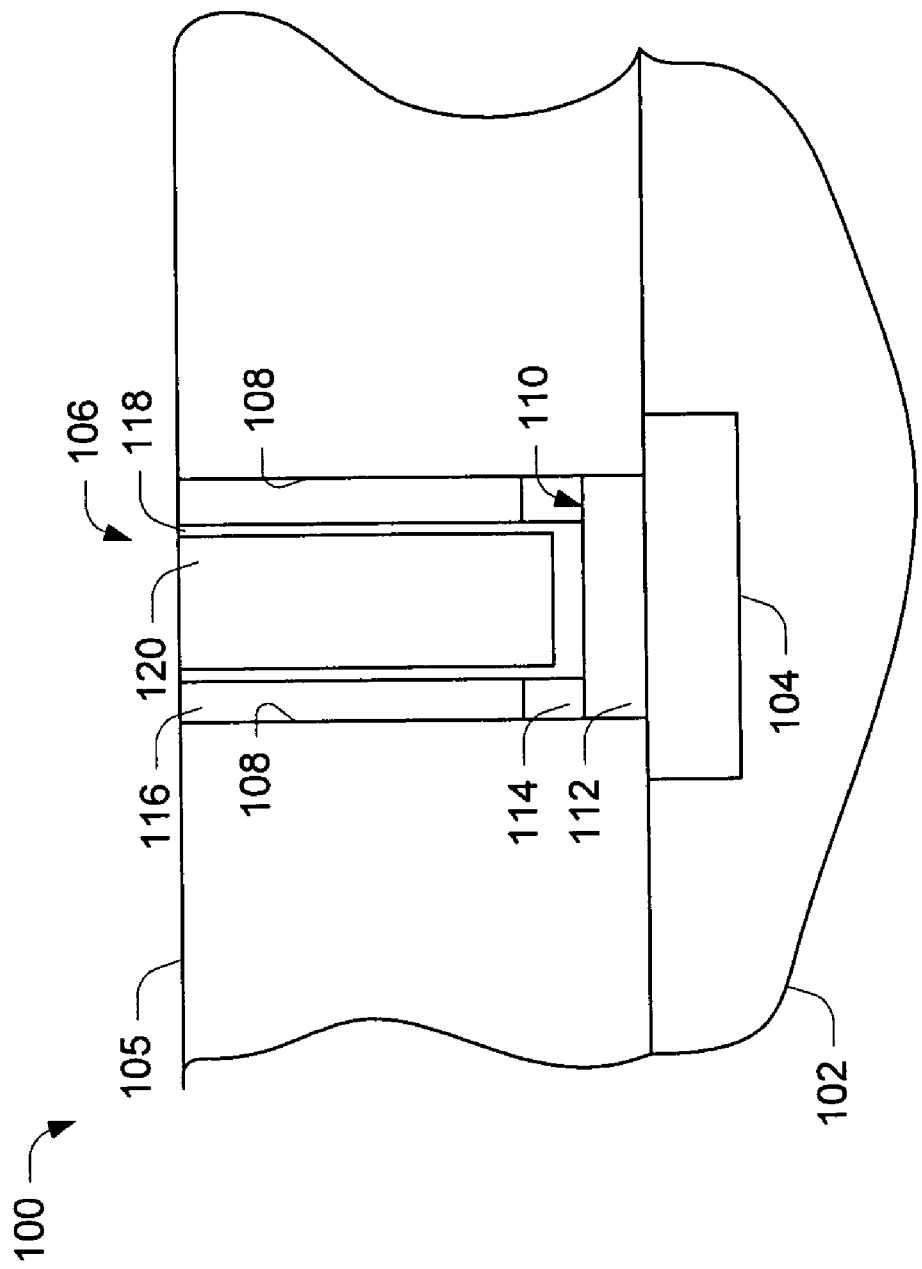
FIG. 5 is a diagrammatic side sectional view of the FIG. 4 substrate at a processing step subsequent to that shown in FIG. 4, in accordance with one embodiment.

Referring to FIG. 5, copper 120 is formed in trench contact 106 and in electrical communication with substrate region 104. Any suitable technique can be utilized to provide copper into the trench contact.

As formed, the barrier that contains the copper comprises a first material that is formed adjacent the sidewalls 108 of trench contact 106. The material that is selected for use in this layer can be selected with an appreciation of the materials that it is to separate which, in this example, comprise $SiO_2$ and copper. In other embodiments where such materials are different from those described above, the material selected for the first material may be different from those described above.

In addition, the barrier that contains the copper comprises a second material that is different from the first material and which is formed over the contact bottom 110 of trench contact 106. The material that is selected for use in this layer can be selected with an appreciation of the materials that it is to separate which, in this example, comprise silicon or a silicon-containing contact material and copper. In other embodiments where such materials are different from those described above, the material selected for the second material may be different from those described above.

Further, in the specific example illustrated above, the barrier comprises multiple different layers that are formed at different times. Each of the layers is formed to overlie portions of the trench contact sidewalls and contact bottom. It is possible, however, to have a barrier architecture that is different from that specifically described above without departing from the spirit and scope of the claimed subject matter. For example, some barrier architectures might be designed to provide only a negligible amount of layer 118 material, if any, over the sidewalls of the trench contact.

Exemplary Method

FIG. 6 is a flow diagram that illustrates acts in a process in accordance with one embodiment. Act 600 forms one or more trench contacts over a substrate region with which electrical connection is desired. Any suitable techniques can be utilized to form the trench contact(s). Act 602 forms a first barrier layer within the trench contact. Any suitable techniques can be utilized to form the first barrier layer, non-limiting examples of which are given above. Act 604 forms a second barrier layer within the trench contact(s). Any suitable techniques can be utilized to form the second barrier layer, non-limiting examples of which are given above. Act 606 forms copper within the barrier layers and in electrical contact with the substrate region. Any suitable techniques can be utilized to form the second barrier layer, non-limiting examples of which are given above.

Exemplary System

Referring to FIG. 7, a block diagram of an exemplary electronic system that can include transistors fabricated with copper interconnects, such as those described above is shown generally at 700. Such electronic system can comprise a computer system that includes a motherboard 710 which is electrically coupled to various components in electronic system 700 via a system bus 720. System bus 720 may be a single bus or any combination of busses.

Motherboard 710 can include, among other components, one or more processors 730, a microcontroller 740, memory 750, a graphics processor 760 or a digital signal processor 770, and/or a custom circuit or an application-specific integrated circuit 780, such as a communications circuit for use in wireless devices such as cellular telephones, pagers, portable computers, two-way radios, and similar electronic systems and a flash memory device 790.

The electronic system 700 may also include an external memory 800 that in turn includes one or more memory elements suitable to the particular application, such as a main memory 820 in the form of random access memory (RAM), one or more hard drives 840, and/or one or more drives that handle removable media 860, such as floppy diskettes, compact disks (CDs) and digital video disks (DVDs). In addition, such external memory may also include a flash memory device 870.

The electronic system 700 may also include a display device 880, a speaker 890, and a controller 900, such as a keyboard, mouse, trackball, game controller, microphone, voice-recognition device, or any other device that inputs information into the electronic system 700.

CONCLUSION

In the embodiments described above, a barrier architecture is provided that includes different materials that are selected to be employed in connection with copper contact applications. Some of the barrier material is formed over trench contact sidewalls, and other different barrier material is formed over trench contact bottoms. By selecting the appropriate barrier materials, contact resistances can be improved while, at the same time, concerns associated with array leakage can be mitigated.

Although the embodiments have been described in language specific to structural features and/or methodological acts, it is to be understood that the subject matter defined in the appended claims is not necessarily limited to the specific features or acts described. Rather, the specific features and acts are disclosed as exemplary forms of implementing the claimed subject matter.

What is claimed is:

1. An apparatus comprising:
   a semiconductive substrate;
   one or more substrate regions within the semiconductive substrate;
   one or more trench contacts respectively disposed over the one or more substrate regions, individual trench contacts having sidewalls and a trench bottom, wherein the trench bottom is defined by an upper surface of a salicide layer;
   a first barrier within the one or more trench contacts formed adjacent the trench sidewalls comprising a first material, wherein the first barrier is separated from the upper surface of the salicide layer by an oxide layer;
   a second barrier within the one or more trench contacts comprising a second material formed adjacent the first barrier and adjacent and in contact with the upper surface of the salicide layer; and copper within the one or more trench contacts and contained by the second barrier.

2. The apparatus of claim 1, wherein the second material has a thickness over individual trench bottoms that is greater than a thickness adjacent corresponding first barrier.

3. The apparatus of claim 1, wherein the first material comprises a metal or metal nitride.

4. The apparatus of claim 1, wherein the one or more substrate regions comprise source regions.

5. The apparatus of claim 1, wherein the one or more substrate regions comprise drain regions.

6. The apparatus of claim 1, wherein the one or more substrate regions comprise gate regions.

7. The apparatus of claim 3, wherein the second material comprises a metal material.

8. A electronic system comprising:
   a bus;
   a processor coupled to the bus; and
   one or more transistors operably coupled to the bus, individual transistors comprising:
      a semiconductive substrate;
      a gate region and source/drain regions supported by the semiconductive substrate;
      one or more trench contacts respectively disposed over one or more of the gate and source/drain regions, individual trench contacts having sidewalls and a trench bottom, wherein the trench bottom is defined by an upper surface of a salicide layer;
      a first barrier within the one or more trench contacts formed adjacent the trench sidewalls comprising a first material, wherein the first barrier is separated from the upper surface of the salicide layer by an oxide layer;
      a second barrier within the one or more trench contacts comprising a second material formed adjacent the first barrier and adjacent and in contact with the upper surface of the salicide layer; and
      copper within the one or more trench contacts and contained by the second barrier and in electrical communication with a respective one of the gate or source/drain regions.

9. The electronic system of claim 8, wherein the second material has a thickness over individual trench bottoms that is greater than a thickness over corresponding trench sidewalls, and wherein the first material comprises a metal or metal nitride and the second material comprises a metal material.

* * * * *